(12) United States Patent
Pang

(10) Patent No.: US 8,022,476 B2
(45) Date of Patent: Sep. 20, 2011

(54) SEMICONDUCTOR DEVICE HAVING VERTICAL AND HORIZONTAL TYPE GATES AND METHOD FOR FABRICATING THE SAME

(75) Inventor: Sung-Man Pang, Gwangmyeong-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 315 days.

(21) Appl. No.: 12/253,253

(22) Filed: Oct. 17, 2008

(65) Prior Publication Data
US 2009/0114980 A1    May 7, 2009

(30) Foreign Application Priority Data
Nov. 5, 2007   (KR) .................. 10-2007-0112124

(51) Int. Cl.
*H01L 29/66* (2006.01)
*H01L 21/336* (2006.01)

(52) U.S. Cl. ............... 257/334; 257/500; 257/E29.257; 257/E29.027; 257/E21.41; 438/270

(58) Field of Classification Search .......... 257/328–330, 257/334, 335, 337, 500–502, 520, 601, 346, 257/350, E29.257, E29.027, E29.262, E29.066, 257/E29.201, E29.197, 169, E21.382, E29.26, 257/E21.417, E21.42, E21.427, E21.4, E21.41, 257/E21.375, E21.376; 438/208, 209, 268, 438/270, 271, 299, 361, 430
See application file for complete search history.

(56) References Cited

U.S. PATENT DOCUMENTS

| | | | | |
|---|---|---|---|---|
| 6,462,377 | B2 * | 10/2002 | Hurkx et al. | 257/339 |
| 7,566,931 | B2 * | 7/2009 | Kocon | 257/328 |
| 2002/0056883 | A1 * | 5/2002 | Baliga | 257/390 |
| 2004/0056284 | A1 * | 3/2004 | Nagaoka et al. | 257/253 |
| 2005/0218431 | A1 | 10/2005 | Nair et al. | |
| 2005/0218472 | A1 * | 10/2005 | Okada et al. | 257/471 |
| 2006/0086998 | A1 * | 4/2006 | Nagaoka | 257/500 |
| 2006/0131645 | A1 | 6/2006 | Kaneko | |
| 2007/0205431 | A1 * | 9/2007 | Robb et al. | 257/119 |
| 2008/0023787 | A1 * | 1/2008 | Shimada et al. | 257/506 |
| 2008/0157193 | A1 * | 7/2008 | Pang | 257/334 |
| 2010/0155837 | A1 * | 6/2010 | Hebert | 257/334 |

FOREIGN PATENT DOCUMENTS
| | | |
|---|---|---|
| CN | 1667838 | 9/2005 |
| JP | 2002-353452 | 12/2002 |
| KR | 10-2006-0054139 | 5/2006 |

* cited by examiner

*Primary Examiner* — Matthew Landau
*Assistant Examiner* — Latanya N Crawford
(74) *Attorney, Agent, or Firm* — Sherr & Vaughn, PLLC

(57) ABSTRACT

A semiconductor device having both vertical and horizontal type gates and a method for fabricating the same for obtaining high integration of the semiconductor device and integration with other devices while also maximizing the breakdown voltage and operational speed and preventing damage to the semiconductor device.

16 Claims, 6 Drawing Sheets

DEVICE TERMINAL

SEMICONDUCTOR DEVICE HAVING VERTICAL AND HORIZONTAL TYPE GATES AND METHOD FOR FABRICATING THE SAME

The present application claims priority under 35 U.S.C. §119 to Korean Patent Application No. 10-2007-0112124 (filed on Nov. 5, 2007), which is hereby incorporated by reference in its entirety.

BACKGROUND

A power MOSFET has a much simpler gate driving circuit than a bipolar transistor due to having a high input impedance. In addition, as a unipolar device, the power MOSFET is also advantageous in view of causing no time delay induced by accumulation or recombination of some minority carriers while the device is being turned off. Accordingly, use of the power MOSFET has been increasing in the fields of a switching mode power supply, a lamp ballast, a motor driving circuit, etc.

A double diffusion MOSFET (DMOSFET) structure using a planar diffusion technology has been generally applied to the power MOSFET. However, a trench gate-type MOSFET structure, so called a vertical gate-type MOSFET structure, in which trenches are formed by etching a semiconductor substrate by a predetermined depth and gates are formed in the trenches is being researched. The trench gate-type MOSFET is capable of implementing high integration and low source-drain on resistance ($R_{ds(on)}$) by increasing the cell density per unit area while reducing a junction field-effect transistor (JFET) resistance among the devices.

Figure 1:
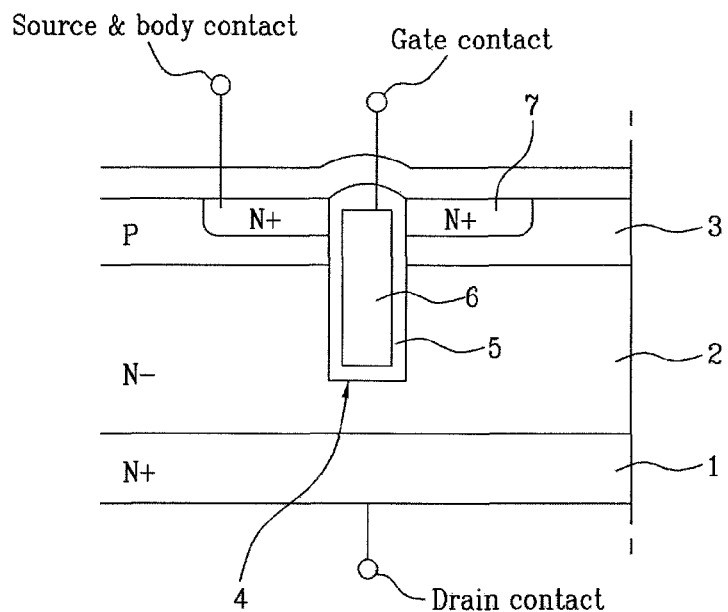

As illustrated in example FIG. 1, the trench gate-type MOSFET is structured in a manner that low-density N-type epitaxial layer 2 is formed on and/or over high-density N-type substrate 1. P-type epitaxial layer 3 is formed on and/or over low-density N-type epitaxial layer 2. P-type epitaxial layer 3 and low-density N-type epitaxial layer 2 are etched to a predetermined depth, accordingly forming trench 4. Gate dielectric layer 5 is applied on and/or over sidewalls and bottom wall of trench 4. Gate electrode 6 is formed on and/or over gate dielectric layer 5 and to fill trench 4. High-density N-type dopant region 7 is formed on and/or over P-type epitaxial layer 3 around trench 4 formed with gate electrode 6. Accordingly, high-density N-type dopant region 7 becomes a source terminal of the MOSFET whereas high-density N-type substrate 1 becomes a drain terminal.

However, the above-described trench gate-type MOSFET has a variety of disadvantages. For instance, a bottom of substrate 1 should be in electric connection in order to apply signals to the drain terminal. Therefore, the trench gate-type MOSFET can be used only as a single device but cannot be integrated with a horizontal-type device. In addition, in a drain extended MOSFET (DEMOS) which is a horizontal-type high-voltage device, channels are formed horizontally. Accordingly, the area occupied by chips is increased to achieve great voltage and current capacity as desired.

SUMMARY

Embodiments relate to a semiconductor device and a fabricating method for the same, and more particularly, to a metal oxide semiconductor field effect transistor (MOSFET) and a method for fabricating the same having vertical-type gates and horizontal-type gates.

Embodiments relate to a semiconductor device having vertical and horizontal type gates, enabling not only high integration but also integration with another device and maximizing a breakdown voltage thereof, by including channels and drains formed in a horizontal direction while maintaining a vertical channel structure.

Embodiments relate to a semiconductor device having vertical and horizontal type gates that may include at least one of the following: a high-density first conduction-type semiconductor substrate, a low-density first conduction-type epitaxial layer formed on and/or over the semiconductor substrate, a plurality of second conduction-type base regions formed spaced apart in a predetermined region of the epitaxial layer, a plurality of high-density first conduction-type source regions formed in the respective base regions excluding the base regions disposed at either or both terminals of the device, a plurality of high-density first conduction-type drain regions formed on and/or over the epitaxial layer disposed between the respective base regions, a plurality of trenches penetrating the respective source regions and the base regions, a first gate electrode formed in each of the trenches, a field oxide layer formed between the respective drain region and base region, and a plurality of second gate electrodes formed on and/or over the base region between the respective source region and drain region, a high-density second conduction-type dopant region formed in the base region formed at either or both terminals of the semiconductor device so that a protection diode can be formed.

Embodiments relate to a semiconductor device that may include at least one of the following: a high-density first conduction-type substrate; a low-density first conduction-type epitaxial layer formed over the high-density first conduction-type substrate; a plurality of first low-density second conduction-type base regions and second low-density second conduction-type base regions formed spaced apart in the low-density first conduction-type epitaxial layer; a high-density first conduction-type source region formed in the first and second low-density second conduction-type base regions; a high-density first conduction-type drain region formed in the epitaxial layer disposed outside of the first and second low-density second conduction-type base regions; a high-density second type dopant region formed in the first low-density second conduction-type base regions; a first gate electrode formed extending through the high-density first conduction-type source region of the second low-density second conduction-type base regions, the second low-density second conduction-type base regions and the first low-density second conduction-type base regions; forming a field oxide layer over the low-density first conduction-type epitaxial layer between the first and second base region and a respective high-density first conduction-type drain region; and a second gate electrode formed over the first and second low-density second conduction-type base regions between the high-density first conduction-type source region and the high-density first conduction-type drain region.

Embodiments relate to a method for fabricating a semiconductor device having vertical and horizontal type gates that may include at least one of the following steps: forming a low-density first conduction-type epitaxial layer on and/or over a high-density first conduction-type substrate, and then forming a plurality of second conduction-type base regions spaced apart on and/or over the epitaxial layer, and then forming a plurality of high-density first conduction-type source regions in the respective base regions excluding a base region formed at either or both terminals of the semiconductor device, and a plurality of high-density first conduction-type drain regions on the epitaxial layer disposed at the outside of the base regions, and then forming a high-density second conduction-type dopant region in the base region formed on and/or over at either or both terminals, and then forming a plurality of trenches to penetrate the centers of the source regions and the base regions, and then forming a first gate electrode in the respective trenches, and then forming a field oxide layer on the epitaxial layer disposed between the base region and the drain region, and then forming a second gate electrode on the base region disposed between the source region and the drain region.

Embodiments relate to that may include at least one of the following steps: forming an epitaxial layer over a substrate; and then simultaneously forming a plurality of first base regions and second base regions spaced apart in the epitaxial layer; and then simultaneously forming a source region in the first and second base regions and a drain region between the first and second base regions; and then forming a protective diode spaced apart from the source region in the first base regions; and then forming a vertical-type gate electrode extending through the first and second base regions and partially in the epitaxial layer, wherein the first gate electrode formed in the first base regions is disposed between the source region and the protective diode; and then forming LOCOS field oxide layer over the epitaxial layer between the drain region and the first and second base regions; and then forming a horizontal-type gate electrode over the LOCOS field oxide layer.

Embodiments relate to a method for fabricating a semiconductor device that may include at least one of the following steps: forming a low-density first conduction-type epitaxial layer over a high-density first conduction-type substrate; and then forming a plurality of first low-density second conduction-type base regions and second low-density second conduction-type base regions spaced apart in the low-density first conduction-type epitaxial layer; and then simultaneously forming a high-density first conduction-type source region in the first and second low-density second conduction-type base regions and a high-density first conduction-type drain region in the epitaxial layer disposed outside of the first and second low-density second conduction-type base regions; and then forming high-density second type dopant regions in the first low-density second conduction-type base regions; and then forming a trench to penetrate the high-density first conduction-type source region of the second low-density second conduction-type base regions, the second low-density second conduction-type base regions and the first low-density second conduction-type base regions; and then forming a first gate electrode in a respective trench; and then forming a field oxide layer over the low-density first conduction-type epitaxial layer between the first and second base region and a respective high-density first conduction-type drain region; and then forming a second gate electrode over the first and second base regions between the high-density first conduction-type source region and the high-density first conduction-type drain region.

DRAWINGS

Example FIG. 1 illustrates a trench gate-type MOSFET.

Example FIGS. 2 to 6A-6E illustrate a semiconductor device having vertical and horizontal type gates and a method of fabricating the same, in accordance with embodiments.

DESCRIPTION

Reference will now be made in detail to embodiments, examples of which are illustrated in the accompanying example drawing figures. Wherever possible, the same reference numbers will be used throughout the drawings to refer to the same or like parts.

Figure 2:
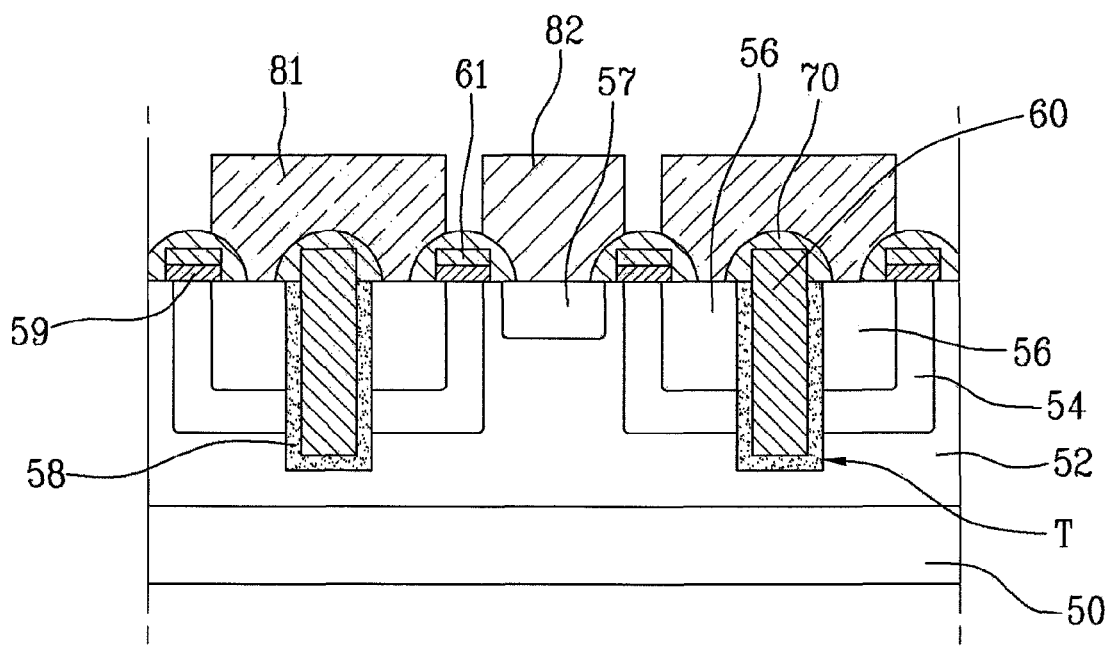

Example FIG. 2 is a sectional view showing the structure of a semiconductor device having vertical and horizontal type gates.

As illustrated in example FIG. 2, low-density N-type epitaxial layer 52 is formed on and/or over high-density substrate 50 having a first conduction type, such as an N-type. Low-density base region 54 having a second conduction type, e.g., a P-type, is formed in epitaxial layer 52. A plurality of the base regions 54 may be formed spaced apart from one another at a predetermined region of epitaxial layer 52. High-density N-type source region 56 is formed in low-density base region 54. High-density N-type drain region 57 is formed in epitaxial layer 52 adjacent to low-density base region 54. Trench T is formed in epitaxial layer 52 at a predetermined depth penetrating source region 56 and base region 54. First gate oxide layer 58 is formed on and/or over sidewalls and a bottom wall of trench T, and first gate electrode 60 is formed on and/or over first gate oxide layer 58 filling trench T. Second gate oxide layer 59 and second gate electrode 61 are formed on and/or over low-density second conduction-type base region 54 disposed between source region 56 and drain region 57. Interlayer dielectric 70 is formed on and/or over an upper most surface and sidewalls of first gate electrode 60 and second gate electrode 61 such that a source contact hole and a gate contact hole are formed respectively at source region 56 and drain region 57. Source line layer 81 and drain line layer 82 are formed on and/or over interlayer dielectric 70 to be in connection with source region 56 and drain region 57 through the respective contact holes. Contact holes are formed at the first gate electrode 60 and second gate electrode 61, and gate line layers are formed in connection with first gate electrode 60 and second gate electrode 61. Therefore, while maintaining a vertical channel structure, the semiconductor device can additionally include channels and drains formed in a horizontal direction, thereby reducing the area thereof and enabling integration with other devices. Moreover, the distance between base region 54 and drain region 57 is decreased so as to reduce the size of the semiconductor device. Such a design may lead to a reduction in an inverse breakdown voltage.

Figure 3:
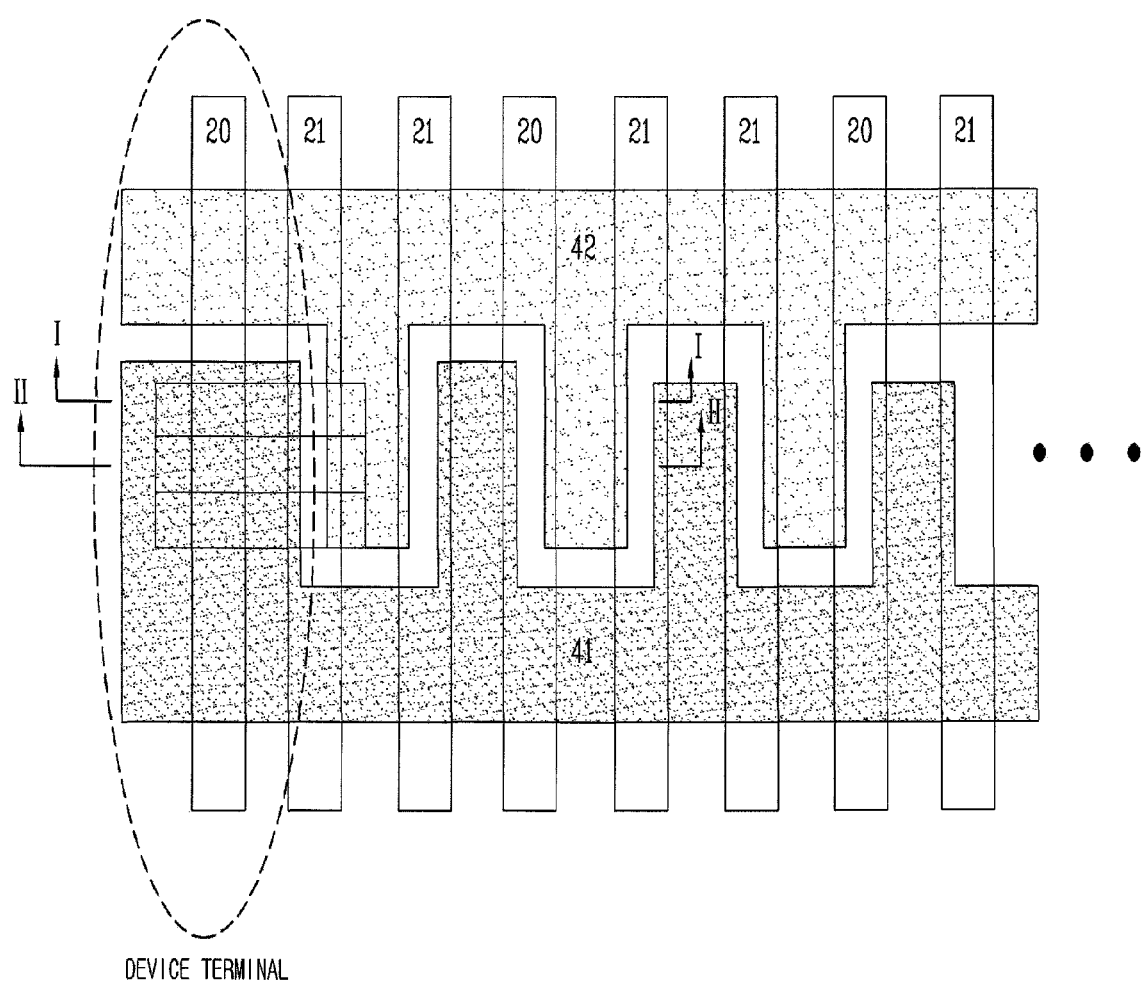
Figure 4:
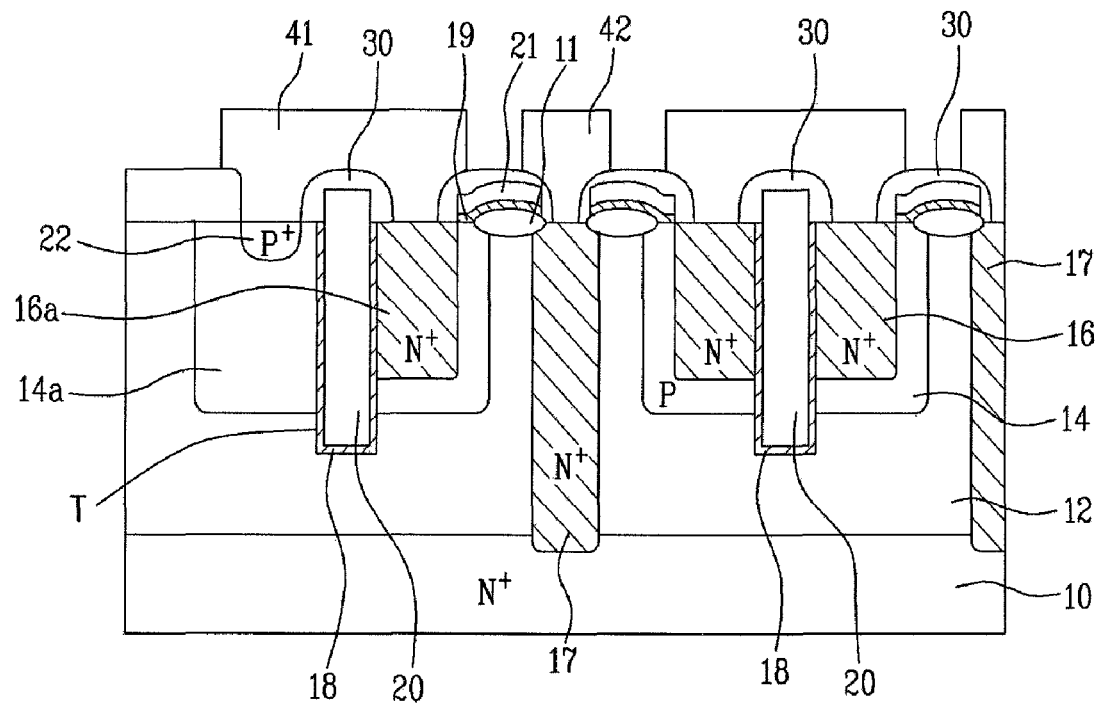
Figure 5:
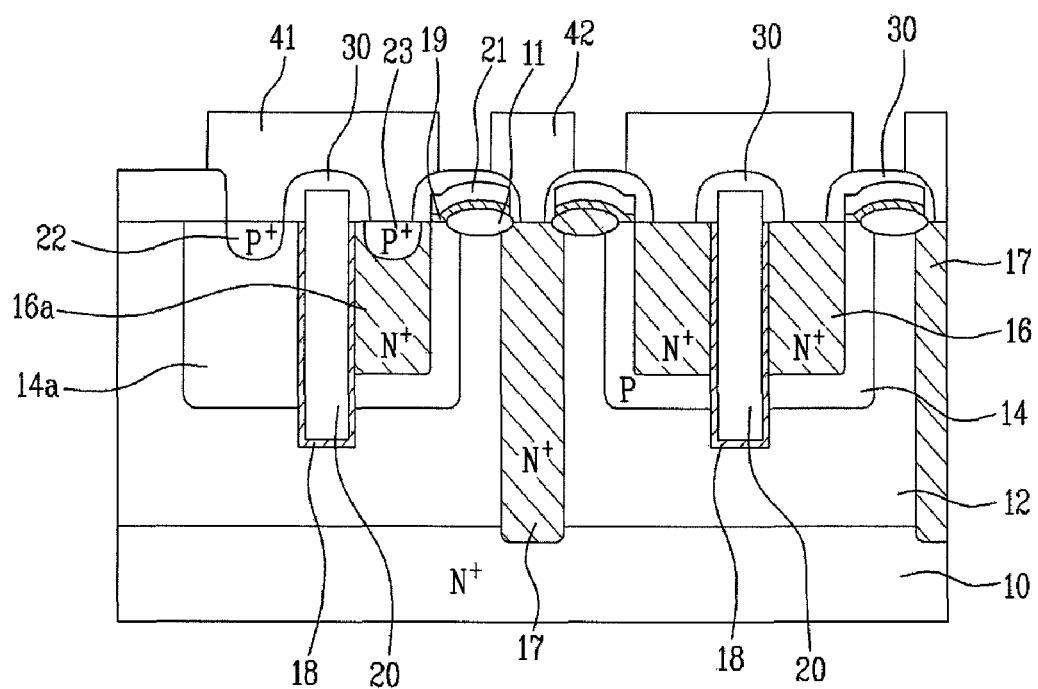

Example FIG. 3 is a plan view of a semiconductor device having vertical and horizontal type gates, example FIG. 4 is a sectional view cut along a line I-I' of example FIG. 3, and example FIG. 5 is a sectional view cut along a line II-II' of example FIG. 3.

As illustrated in example FIGS. 3 to 5, a semiconductor device having vertical and horizontal type gates in accordance with embodiments is structured in such a manner that low-density N-type epitaxial layer 12 is formed on and/or over a high-density first conduction-type, for example, an N-type buried layer or substrate 10. A low-density second conduction-type, for example, P-type base region 14 is formed in epitaxial layer 12. Base region 14 is formed by implanting P-type dopant ions in a predetermined part of epitaxial layer 12, in a geometric shape having a half-circle such as hemisphere, hemispheric column or cubic cross-section. A plurality of base regions 14 may be arranged spaced apart. High-density N-type source region 16 is formed in base region 14 while high-density N-type drain region 17 is formed in epitaxial layer 12 adjacent base region 14. Drain region 17 may be formed in epitaxial layer 12 in spaces between respective base regions 14. Drain region 17 may extend through epitaxial layer 12 in order to be connected to high-density N-type buried layer or substrate 10. Local oxidation of silicon (LOCOS) field oxide layer 11 is formed on and/or over epitaxial layer 12 and disposed between base region 14 and drain region 17. LOCOS field oxide layer 11 may serve to increase the breakdown voltage between horizontal gate electrode 21 that will be subsequently formed and drain region 17.

Trench T is formed in epitaxial layer 12 at a predetermined depth penetrating source region 16 and base region 14. First gate oxide layer 18 is formed on sidewalls and a bottom wall of trench T and first gate electrode 20 extending vertically is formed on and/or over first gate oxide layer 18 inside trench T. Second gate oxide layer 19 and second gate electrode 21 extending horizontally are formed on and/or over LOCOS field oxide layer 11 and low-density second conduction-type base region 14 disposed between source region 16 and drain region 17. Interlayer dielectric layer 30 is formed on and/or over an uppermost surface and lateral sidewalls of first gate electrode 20 and second gate electrode 21 such that a source contact hole and a gate contact hole are formed respectively at source region 16 and drain region 17. Source line layer 41 and drain line layer 42 are formed on and/or over interlayer dielectric 30 to be connected with source region 16 and drain region 17 through the respective contact holes. Contact holes are also formed exposing first gate electrode 20 and second gate electrode 21 so that gate line layers are formed in connection with first gate electrode 20 and second gate electrode 21. Meaning, first gate electrode 20 and second gate electrode 21 are interconnected at a terminal of the semiconductor device.

A high-voltage semiconductor device is required to endure a high voltage between the drain and the source in an off-state, and to allow a large-quantity high-rate current between the drain and the source in an on-state. A body diode is formed by the P-N junction of P-type base region 14 and N-type epitaxial layer 12. In a semiconductor device equipped with MOS elements, when driving an inductor load through a push-pull structure or bridge structure, there exists an operation region of a reverse conductor and a forward conductor of the body diode. When the current of the body diode is great, minority carriers are accumulated and the diode off is delayed. Furthermore, a parasitic bipolar junction transistor may be operated.

Therefore, in accordance with embodiments, high-density P-type dopant region 22 is formed, instead of the source regions in the base regions at either or both terminals of the semiconductor device so as to form a protection diode, to prevent damage to the semiconductor device by a high voltage while maximizing operational speed. More specifically, the protection diode is formed at either or both terminals of the semiconductor device having vertical and horizontal type gates. The same structure can be applied to the both terminals.

As illustrated in example FIG. 4, first high-density P-type dopant region 22 is formed, instead of the source region, within base region 14a disposed laterally to the left of first vertical gate electrode 20 formed at a terminal of the semiconductor device, thereby producing the protection diode.

As illustrated in example FIG. 5, while the protection diode is formed by forming high-density P-type dopant region 22 instead of the source region in left base region 14a of first vertical gate electrode 20 at the terminal, source region 16a is also formed within base region 14a disposed laterally to the right of first vertical gate electrode 20 at the terminal. Moreover, second high-density P-type dopant region 23 is formed in source region 16a laterally to the right of first vertical gate electrode 20 at the terminal. The area ratio of second high-density p-type dopant region 23 to source region 16a may be set in a range between approximately 1:10 to 1:5. Therefore, the protection diode is formed at the terminal of the semiconductor device, and a bias of base region 14 is applied through high-density P-type dopant region 23. Accordingly, the semiconductor device can be protected from damage by the high voltage while being improved in the operational speed.

Example FIGS. 6A through 6E are sectional views cut along the line I-I' of example FIG. 3, showing the steps of fabricating a semiconductor device in accordance with embodiments.

Figure 6A:
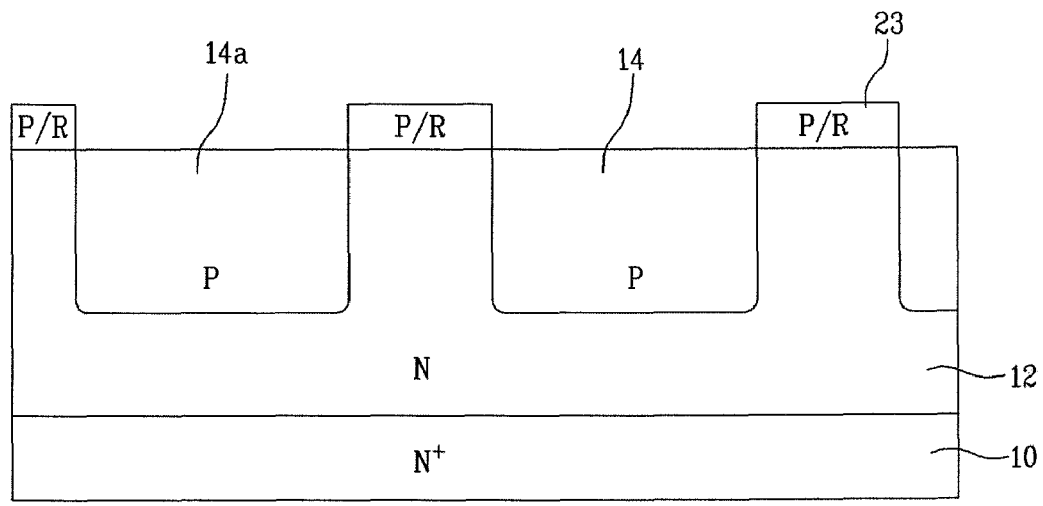

As illustrated in example FIG. 6A, low-density N-type epitaxial layer 12 is grown on and/or over a substrate including the high-density first conduction-type, for example N-type, buried layer or on and/or over a high-density first conduction-type, for example N-type substrate 10. A plurality of low-density second conduction-type, e.g. P-type, base regions 14, 14a are formed in epitaxial layer 12 at spaced predetermined, constant intervals. Base regions 14, 14a may be formed having one of a rectangular, hemispherical, hemispherical column and cubical cross section. Base regions 14, 14a may be produced by implanting ions of boron (B) at a dosage in a range between approximately 1E13 to 7E15 ions/cm$^2$ and an ion implantation energy in a range between approximately 40 to 100 KeV. More particularly, first photosensitive layer 23 is vapor-deposited on and/or over the whole surface of epitaxial layer 12 and then patterned through exposure and development operations such that base regions 14, 14a are exposed. Using the patterned first photosensitive layer 23 as a mask, the P-type dopant ions are implanted in epitaxial layer 12, thereby producing base regions 14, 14a.

Figure 6B:
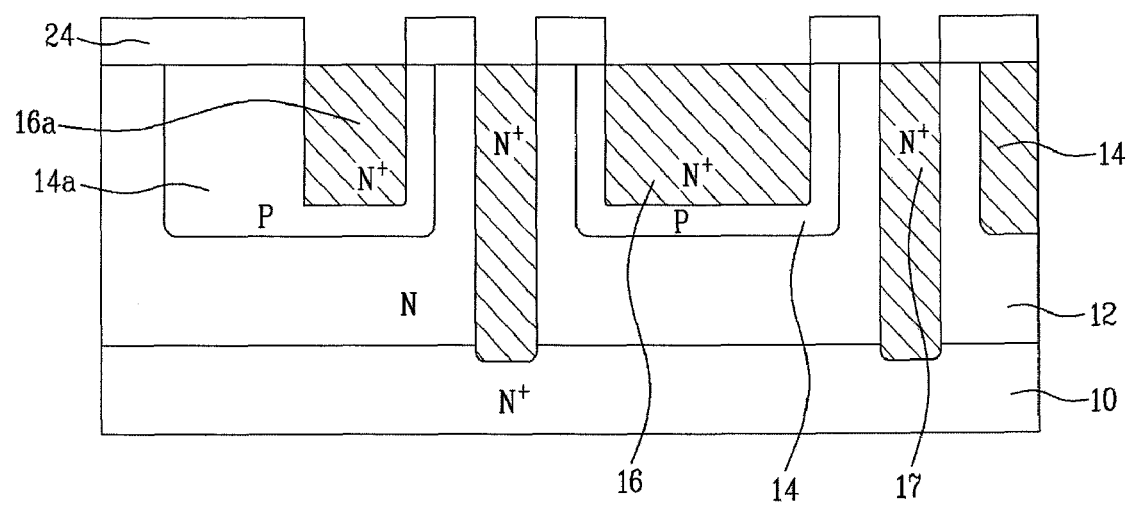

As illustrated in example FIG. 6B, the high-density first conduction-type, e.g., N-type dopant ions are then implanted in base regions 14, 14a and in a portion of epitaxial layer 12 disposed between base regions 14, 14a, thereby forming high-density N-type source regions 16, 16a and drain region 17. More particularly, after first photosensitive layer 23 is removed, second photosensitive layer 24 is vapor-deposited on and/or over the whole surface of epitaxial layer 12 and then patterned through exposure and development operations such that base regions 14, 14a and a portion of epitaxial layer 12 deposed between base regions 14, 14a are exposed. Using the patterned second photosensitive layer 24 as a mask, the N-type dopant ions are implanted at high density, accordingly producing source regions 16, 16a and drain region 17. Arsenic (As) ions are implanted at a dosage in a range between approximately 5E14 to 1E16 ions/cm$^2$ and ion implantation energy in a range between approximately 20 to 100 KeV. When drain region 17 is connected with high-density N-type buried layer or substrate 10, higher ion implantation energy is applied. In accordance with embodiments, no source region may be formed in base region 14a disposed at either or both terminals, or source region 16a may be formed only in a portion of base region 14a. After second photosensitive layer 24 is removed, high-density P-type dopant region 22 is formed by photolithography in base region 14a (and/or in source region 16a of base region 14a) as illustrated in example FIGS. 4 and 5.

Figure 6C:
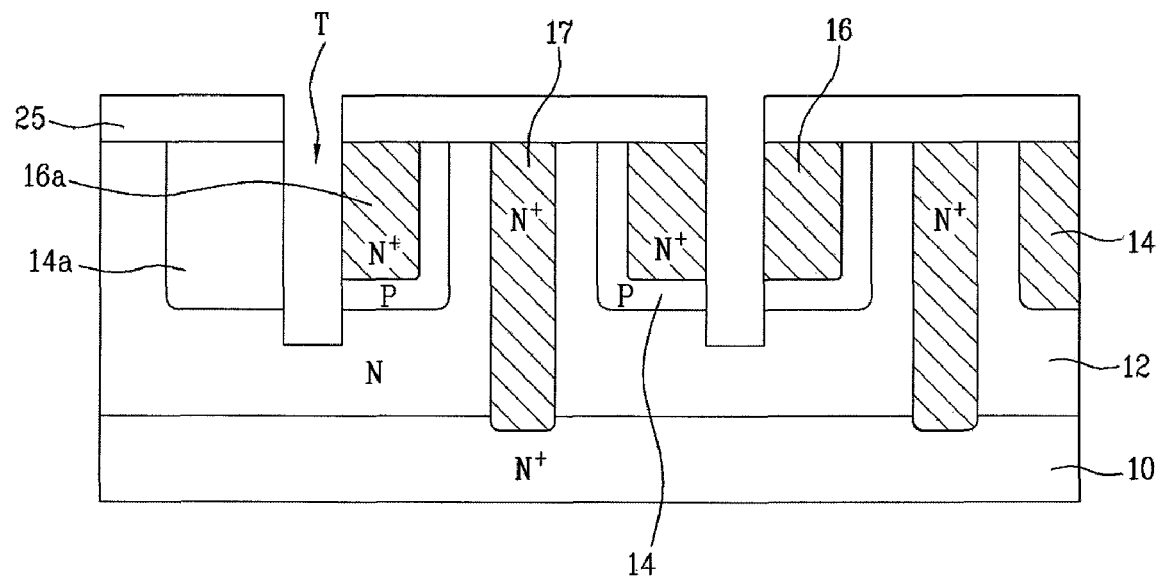
Figure 6D:
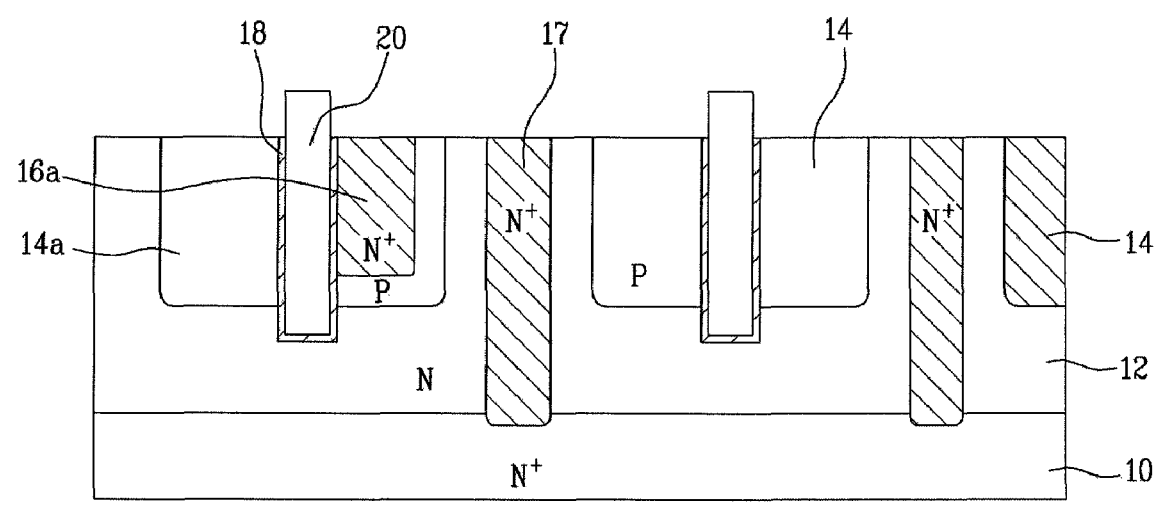

As illustrated in example FIGS. 6C and 6D, a plurality of trenches T are formed centrally disposed in respective base regions 14, 14a to penetrate source region 16 and base region 14. Third photosensitive layer 25 is vapor-deposited on and/or over the whole surface of epitaxial layer 12 and then patterned through exposure and development operations such that the regions where trenches T will be formed are exposed. Epitaxial layer 12 and base region 14 or 14a are partially etched using the patterned third photosensitive layer 25 as a mask, thereby forming trenches T. Next, first gate oxide layer 18 is formed on an inner wall of each trench T, and a conductive layer, for example a polysilicon applied with dopants, is formed in trench T and on and/or over first gate oxide layer 18.

Accordingly, first gate electrodes 20 are formed. For example, the polysilicon layer is formed up to a middle height of third photosensitive layer 25, such that the polysilicon layer extends from the uppermost surface of base regions 14, 14a. Third photosensitive layer 25 is then removed.

Figure 6E:
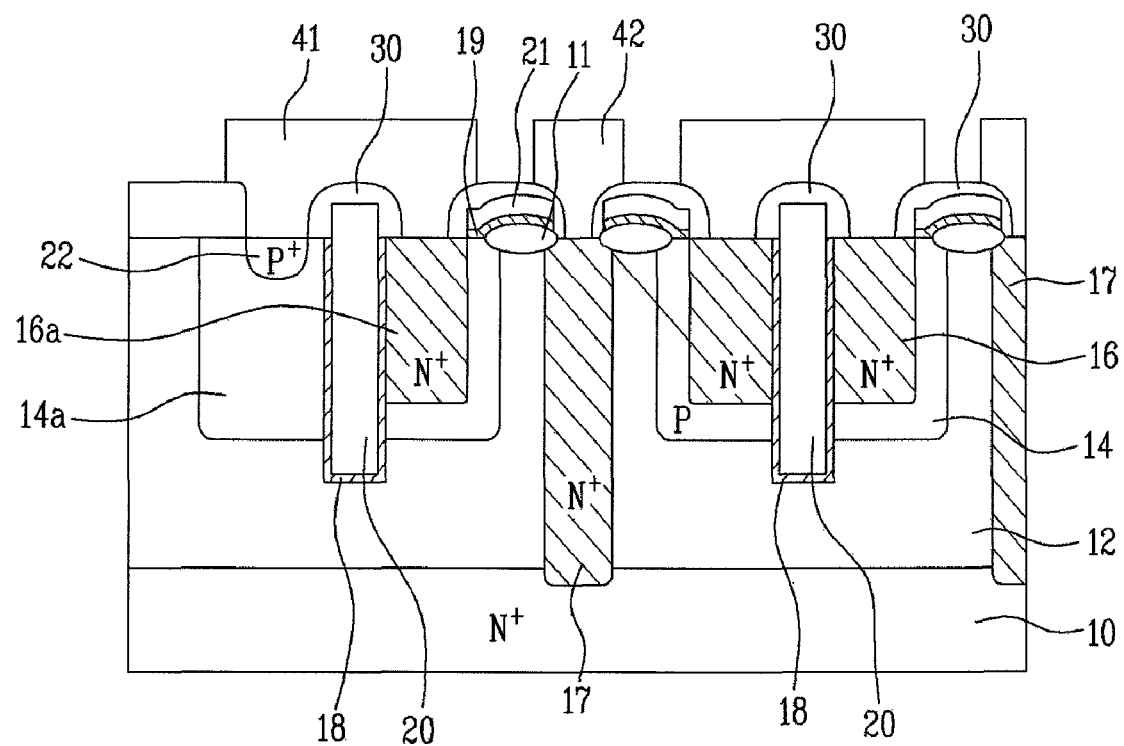

As illustrated in example FIG. 6E, LOCOS field oxide layer 11 is formed on and/or over epitaxial layer 12 disposed between drain region 17 and base regions 14, 14a. Field oxide layer 11 functions to increase the breakdown voltage between horizontal gate electrode 21 and drain region 17. High-density P-type dopant region 22 is formed using a photosensitive layer. Second gate oxide layer 19 and second gate electrode 21 are formed on and/or over low-density second conduction-type base regions 14, 14a disposed between source region 16 and drain region 17. Interlayer dielectric 30 is formed on and/or over an uppermost surface and lateral sidewalls of first gate electrode 20 and second gate electrode 21 such that a source contact hole and a gate contact hole are formed respectively at source regions 16, 16a and drain region 17. Source line layer 41 and drain line layer 42 are formed on and/or over interlayer dielectric 30 to be connected with source regions 16a, 16b and drain region 17 through the respective contact holes. The contact holes are formed at first gate electrode 20 and second gate electrode 21 thereby forming gate line layers. Meaning, first gate electrode 20 and second gate electrode 21 are interconnected at a terminal of the semiconductor device.

In accordance with embodiments, a semiconductor device having vertical and horizontal type gates and a fabricating method thereof have at least the following advantages. Since channels and drains are horizontally formed, while maintaining a vertical channel structure which is an advantage of a trench gate-type MOS device, not only high integration but also integration with other devices can be achieved. Also, a breakdown voltage of the semiconductor device can be maximized because the LOCOS oxide layer is formed on and/or over the epitaxial layer formed between the base region and the drain region. In addition, high-density P-type dopant region 22 is formed instead of a source region, in base region 14a laterally disposed from first vertical gate electrode 20 of the terminal, such that the protection diode can be formed. Furthermore, since the high-density P-type dopant region, instead of a source region, is formed in the base region at either or both terminals and the protection diode is formed, the semiconductor device can be prevented from being damaged by the high voltage while being improved in operational speed.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A semiconductor device comprising:
a high-density first conduction-type substrate;
a low-density first conduction-type epitaxial layer formed over the high-density first conduction-type substrate;
a plurality of first low-density second conduction-type base regions and second low-density second conduction-type base regions formed spaced apart in the low-density first conduction-type epitaxial layer;
a high-density first conduction-type source region formed in the first and second low-density second conduction-type base regions;
a high-density first conduction-type drain region formed in the epitaxial layer disposed outside of the first and second low-density second conduction-type base regions;
a high-density second type dopant region formed in the first low-density second conduction-type base regions;
a first gate electrode formed extending through the high-density first conduction-type source region of the second low-density second conduction-type base regions, the second low-density second conduction-type base regions and the first low-density second conduction-type base regions;
forming a field oxide layer over the low-density first conduction-type epitaxial layer between the first and second base region and a respective high-density first conduction-type drain region; and
a second gate electrode formed over the first and second low-density second conduction-type base regions between the high-density first conduction-type source region and the high-density first conduction-type drain region.

2. The semiconductor device of claim 1, wherein the first gate electrode is formed in the first low-density second conduction-type base regions between the high-density second conduction-type dopant region and the high-density first conduction-type source region.

3. The semiconductor device of claim 1, wherein the trenches are formed in the center of a respective first and second low-density second conduction-type base region.

4. The semiconductor device of claim 1, wherein the high-density first conduction-type drain region is electrically connected to the high-density first conduction-type substrate.

5. The semiconductor device of claim 1, further comprising:
a source line electrically connecting the respective high-density first conduction-type source regions; and
a drain line electrically connecting the respective high-density first conduction-type drain regions.

6. The semiconductor device of claim 1, wherein the first gate electrodes and the second gate electrodes are interconnected at one terminal of the semiconductor device.

7. The semiconductor device of claim 1, wherein the first gate electrode comprises a vertical-type gate electrode.

8. The semiconductor device of claim 1, further comprising an interlayer dielectric layer formed over an uppermost surface and lateral sidewalls of the first gate electrode and the second gate electrode.

9. The semiconductor device of claim 3, wherein the high-density first conduction-type source region is formed in the first low-density second conduction-type base regions disposed laterally at one side of the first gate electrode.

10. The semiconductor device of claim 9, wherein the high-density second conduction-type dopant region is formed in the first low-density second conduction-type base regions disposed laterally at the other side of the first gate electrode.

11. The semiconductor device of claim 10, wherein high-density second conduction-type dopant region comprises a protection diode.

12. The semiconductor device of claim 8, wherein the second gate electrodes comprise horizontal-type gate electrodes.

13. The semiconductor device of claim 12, further comprising a source line layer electrically connected to a respective high-density first conduction-type source region and a drain line layer electrically connected to a respective high-density first conduction-type drain region over the interlayer dielectric layer.

14. A method for fabricating a semiconductor device comprising:

forming a low-density first conduction-type epitaxial layer over a high-density first conduction-type substrate; and then forming a plurality of first low-density second conduction-type base regions and second low-density second conduction-type base regions spaced apart in the low-density first conduction-type epitaxial layer; and then simultaneously forming a high-density first conduction-type source region in the first and second low-density second conduction-type base regions and a high-density first conduction-type drain region in the epitaxial layer disposed outside of the first and second low-density second conduction-type base regions; and then forming high-density second type dopant regions in the first low-density second conduction-type base regions; and then forming a trench to penetrate the high-density first conduction-type source region of the second low-density second conduction-type base regions, the second low-density second conduction-type base regions and the first low-density second conduction-type base regions; and then forming a first gate electrode in a respective trench; and then forming a field oxide layer over the low-density first conduction-type epitaxial layer between the first and second low-density second conduction-type base regions and a respective high-density first conduction-type drain region; and then forming a second gate electrode over the first and second low-density second conduction-type base regions between the high-density first conduction-type source region and the high-density first conduction-type drain region.

15. The method of claim 14, wherein the first gate electrode is formed in the first low-density second conduction-type base regions between the high-density second conduction-type dopant region and the high-density first conduction-type source region.

16. The method of claim 14, wherein the high-density first conduction-type drain region is electrically connected to the high-density first conduction-type substrate.

* * * * *